United States Patent [19]

Matthews

[11] Patent Number: 4,682,370
[45] Date of Patent: * Jul. 21, 1987

[54] APPARATUS FOR AUTOMATICALLY DETECTING AND PLAYING DESIRED AUDIO SEGMENTS OVER A BROADCAST RECEIVER

[76] Inventor: Gordon H. Matthews, 5301 Mariners Way, Plano, Tex. 75075

[*] Notice: The portion of the term of this patent subsequent to Feb. 12, 2002 has been disclaimed.

[21] Appl. No.: 699,844

[22] Filed: Feb. 8, 1985

Related U.S. Application Data

[63] Continuation-in-part of Ser. No. 434,868, Oct. 15, 1982, Pat. No. 4,499,601.

[51] Int. Cl.$^4$ .......................... H03J 7/18; H04B 1/16
[52] U.S. Cl. ........................................ 455/166; 455/2; 455/184; 455/186
[58] Field of Search ............... 455/2, 67, 161, 166, 455/184–186, 228, 349; 381/41–43, 110

[56] References Cited

U.S. PATENT DOCUMENTS

| | | | |
|---|---|---|---|
| 3,760,275 | 9/1973 | Ohsawa et al. | 455/2 |
| 3,919,479 | 11/1975 | Moon et al. | 455/67 |
| 4,063,031 | 12/1977 | Grunza | 381/43 |
| 4,123,717 | 10/1978 | Yiu et al. | 455/166 |
| 4,230,990 | 10/1980 | Lert, Jr. et al. | 455/67 |
| 4,450,531 | 5/1984 | Kenyon et al. | 455/2 |

Primary Examiner—Jin F. Ng
Attorney, Agent, or Firm—Jerry W. Mills; Gregory M. Howison; Jefferson Perkins

[57] ABSTRACT

The specification discloses a method and apparatus for detecting and playing desired audio segments over a broadcast receiver such as a radio or television. Apparatus is coupled with the broadcast receiver (32) to enable the listener to listen to any of a plurality of different stations and to select desired audio segments being played on any of the stations. Alternatively, desired audio segments may be input from external sources such as a radio station or a ROM chip (18). A memory (44) is provided to store the selected desired audio segments selected by the listener. Memories (43) and (44) store externally loaded audio segments. A controller (50) scans the audio being broadcast by each of a plurality of different stations. A comparator (45) compares the selected desired audio segments with the audio scanned. In response to the comparison, the desired audio segments are played over the broadcast receiver upon occurrence of the desired audio segments on any of a plurality of different stations.

31 Claims, 9 Drawing Figures

APPARATUS FOR AUTOMATICALLY DETECTING AND PLAYING DESIRED AUDIO SEGMENTS OVER A BROADCAST RECEIVER

RELATED APPLICATIONS

This application is a continuation-in-part of patent application Ser. No. 434,868, filed Oct. 15, 1982, now U.S. Pat. No. 4,499,601.

TECHNICAL FIELD

This invention relates to a broadcast receiver, and more particularly relates to a method and apparatus for detecting and playing desired audio segments over a broadcast receiver.

BACKGROUND OF THE INVENTION

With the advent of modern broadcast receivers such as radio and television, a wide variety of program material is continually broadcast over a wide range of different stations. These stations are detected by a large number of broadcast receivers located in automobiles, homes, offices and the like. This wide proliferation of program material has provided a wide variety of listening material, but has also made it difficult for the listener to hear specific desired audio segments.

For example, listeners often develop a fondness for certain musical compositions or songs, but are unable to hear such songs more than a few times each day. Due to the large number of stations available, it is not practical to continually tune the broadcast receiver in order to hear such favorite songs. Similarly, it is often difficult to locate and hear news broadcasts or other programs involving particular personalities, and it is difficult to insure hearing certain disaster warning signals.

A need has thus arisen for a method and system to enable a listener to hear desired audio segments whenever the segments are broadcast, no matter on which station they are occurring. Such a system would require the flexibility of enabling the listener to select any desired audio segment to be subsequently played, whether it be a song, musical composition, news broadcast or the like. With such a system, it would also be advantageous to be able to load in desired audio segments, such as a "top ten song list", from an external source. Thereafter, it would be desirable for the broadcast receiver to automatically detect the occurrence of the desired audio segments and play it for the listener's enjoyment.

SUMMARY OF THE INVENTION

In accordance with the present invention, apparatus is coupled with a broadcast receiver in order to detect and play desired audio segments selected by the listener. Desired audio segments are input and stored from an external source such as a semiconductor read only memory or from a radio station. The occurrence of one of the stored desired audio segments is then detected on any of a plurality of radio stations being received by the receiver. In response to the detection of the desired audio segment, the desired audio segment is then broadcast over the receiver for the enjoyment of the listener. After broadcast of the audio segment, the receiver automatically retunes to the last station listened to or, alternatively, the receiver remains on the station and the receiver becomes silent or continues to play until the next audio segment is detected. In addition, the receiver may detect a preselected warning signal that plays a warning audio message on a selected station.

In accordance with another aspect of the invention, a system is provided to detect and play desired audio segments over a broadcast receiver which can receive and broadcast audio programs from a plurality of different stations. The listener selects desired audio segments the listener wishes to subsequently hear or, alternatively, a list of desired audio segments is loaded into the system from an external source. Representations of these selected desired audio segments are stored in a memory. The audio being broadcast by each of the plurality of different stations is continuously scanned for content. The stored representations of desired audio segments are compared with the audio being scanned. In response to a favorable comparison, a desired audio segment is played over the broadcast receiver upon occurrence on any of the plurality of different stations. In this way, the listener may select and hear a favorite song, no matter on which station in the receiving range of the braodcast receiver the song is currently being played.

BRIEF DESCRIPTION OF THE DRAWINGS

For a more complete understanding of the present invention and the advantages thereof, reference is now made to the following description taken in conjunction with the accompanying drawings in which.

DESCRIPTION OF THE PREFERRED EMBODIMENT

Figure 1:
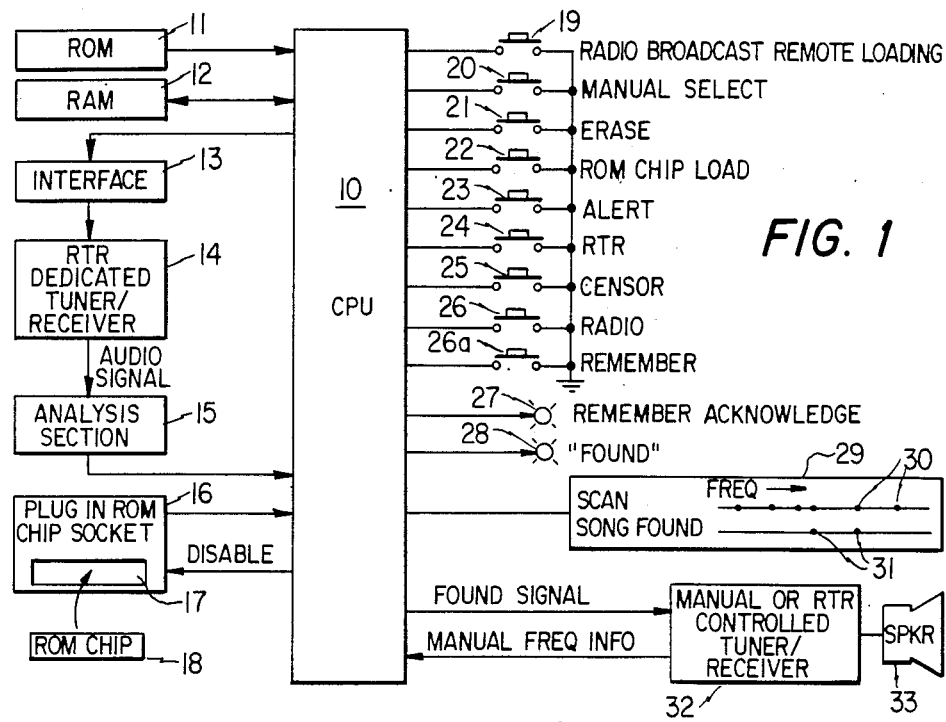
FIG. 1 is a block diagram of the preferred embodiment of the invention.

Referring to FIG. 1, the present system includes a digital CPU 10 which is interconnected with a read only memory (ROM) 11 and a random access memory (RAM) 12. An interface 13 connects a dedicated radio tuner/receiver 14 and an analysis section 15 to the CPU 10. A plug-in ROM chip socket 16 includes a socket opening 17 for receiving a ROM chip 18, or RAM or other suitable storage device. Socket 16 includes electrical connectors for applying power and receiving signals from the ROM chip 18. Chip 18 may be selectively inserted or removed from socket opening 17 when desired. As will be subsequently described, representations of desired audio signals, such as a "top ten song list", may be stored in ROM chip 18 for input into the present system.

A "Radio Broadcast Remote Loading" button 19 is provided to enable loading of desired representations of audio segments into the system from a radio station. A "Manual Select" button 20 is connected between circuit ground and the CPU 10, in order to allow the listener to store desired specific audio segments in the system from a broadcast station currently being listened to in Mode I of operation, as will be described. An "Erase" button 21 is connected between circuit ground and the CPU 10. Erase button 21 may be depressed once to erase one stored audio segment, and may be depressed twice to erase all stored audio segments. A "ROM Chip Load"

button 22 is connected between ground and CPU 10 to enable loading of information from ROM chip 18. An "Alert" button 23 is provided to enable the system to search out and play a selected alert signal. An "RTR" button 24 enables the system to search out and play the selected audio segments over the receiver. A "Censor" button 25 may be depressed to prevent future playing of a particular audio segment. A "Radio" button 26 may be depressed to cause the radio to operate in its normal manner. A "Remember" button 26a may be depressed to store desired representations of audio segments in Modes 2 and 3, as will be described.

A "Remember Acknowledge" light 27 is connected to an output of the CPU and is energized to indicate an audio segment has been stored by the system, as will be subsequently described. A "Found" light 28 is connected to the output of CPU 10 and is energized when a stored audio segment is detected. A display 9 is connected to CPU 10 and displays at locations 30 the radio stations being scanned and monitored by the system. Display 29 also displays at locations 31 which of the radio stations is currently playing an audio segment which is being temporarily loaded in the system, as will be later described. A conventional radio tuner/receiver 32, such as a car radio, is interconnected to the output of the CPU 10 and is operated in accordance with the CPU 10 in a manner to be subsequently described. Audio messages are broadcast in the conventional manner from a speaker 33 connected to the tuner/receiver 32. Instead of a separate RTR dedicated tuner/receiver 14, tuner/receiver 32 may be multiplexed or time shared to provide the functions of tuner/receiver 14.

In operation of the system shown in FIG. 1, button 26 may be depressed so that the tuner/receiver 32 is operated in the known manner in order to broadcast audio messages such as music, news, sports and many other types of audio messages. The tuner/receiver 32 may, for example, be located within an automobile, may comprise a home radio, or may comprise other types of broadcast receivers such as televisions or the like. The present device is useful with a wide variety of broadcast receivers wherein it is desired to automatically detect and play desired audio segments.

If the automatic detection and play feature of the present invention is desired, RTR button 24 is depressed. This causes CPU 10 to actuate the "Radio That Remembers" function, hereinafter termed the "RTR" function. When the RTR function is selected, the listener may listen to the broadcast receiver in the normal manner. In one mode of operation, when the listener hears the first part of a particular audio message, such as a song which he desires to have remembered, the "Manual Select" button 20 is depressed by the listener. The CPU 10 operates to apply the portion of the song heard by the listener to the analysis section 15, then converts the analyzed initial portion of the song to a digitized format and stores the digitized audio segment in RAM 12, and Remember light 27 is energized. Thereafter, the RTR dedicated tuner/receiver 14 automatically monitors various stations being received by the tuner/receiver 32.

The audio signals generated from receiver 14 are applied through the analysis section 15 which continually analyzes the audio signals generated from receiver 14. The output from the analysis section 15 is applied to the CPU 10 which compares the output of the analysis section 15 with the stored signals in RAM 12 which were generated as a result of depression of the "Manual Select" button 20. When the CPU 10 determines a match between the output of analysis section 15 and the information stored in RAM 12, a "found" signal is generated, light 28 is energized, and signals are applied to the RTR select input of the tuner/receiver 32. The RTR select signals control the tuner in order to tune the receiver to the desired station, such that the desired musical composition is played over the speaker 33. After playing of the desired song, the analysis section 15 determines the end of the song or beginning of the next song and the receiver 32 is returned back to the original station. If desired, CPU 10 may be programmed to leave the receiver 32 at the station being listened to, instead of on the original station. When the user is listening to a song selected by the system and it is desired to erase that representation of the audio segment previously stored in the system, the "Erase" button 21 may be depressed once.

In operation of only the alert button 23, wherein buttons 24 and 26 are not operated, the radio does not play until a preselected warning signal is received (such as a Conalrad warning signal), whereupon the tuner/receiver 32 is automatically tuned to the desired Conalrad station. If only RTR button 24 is depressed, the tuner/receiver 32 is silent until the system detects a stored audio segment, whereupon the audio segment is then played over the tuner/receiver 32. If only Radio button 26 is depressed, the radio operates in the normal manner. If all three buttons 23, 24 and 26 are depressed, the tuner/receiver 32 operates in the normal manner to play a radio station, until one of the stored audio segments (either internally or externally stored as will be subsequently described) is detected by the system on another station, wherein the tuner/receiver 32 is switched to the other station. If the preselected warning signal is received, the tuner/receiver 32 is also switched to the preselected station. In case of simultaneous occurrence of detection of a stored audio segment and the preselected warning signal, the CPU 10 gives precedence to the warning signal.

With the use of the present invention, the listener of a radio may internally select the beginning of one or more favorite audio segments such as musical compositions, sports or news shows, by operation of the "Manual Select" button 20. The system stores these desired audio segments and continually searches the broadcast stations to determine when the segments again occur. Upon detection of the segments, the full audio segments are automatically broadcast over the speaker 33 (or directed to a tape recorder or other peripheral equipment). The listener is thus assured of hearing his favorite song, no matter on which station the song occurs. As will be subsequently described, a series of songs or other audio segments may be internally stored by the present system such that the system automatically plays and automatically broadcasts any of desired audio segments, regardless of which station to which the receiver is tuned.

Instead of using the Manual Select button 20, the system may be loaded with desired audio segments from external sources. For example, the button 19 may be depressed in order that representations of audio information from a radio station can be stored. This stored audio information is then used to cause desired songs to be played. As an example, the announcer of a radio station may announce that a list of "Top 10" songs will be broadcast. The user can then push button 19 to cause the "Top 10" list to be stored in the system. The "Top 10" list may be coded and broadcast in compressed form to enable fast loading by the system.

In a second type of external loading, ROM chip 18 may be inserted in socket 16, and button 22 depressed in order to load in the "Top 10" information on ROM chip 18 into the system. Depression of button 22 causes CPU 10 to generate appropriate loading signals to chip socket 16 to cause signals stored in ROM chip 18 to be loaded into memory. The information on chip 18 may be encoded in digital form to facilitate operation of the detection circuitry of the invention. An advantage of the ROM chip 18 is that many different combinations of audio segments may be stored on different chips which may be easily inserted into the system.

Figure 2:
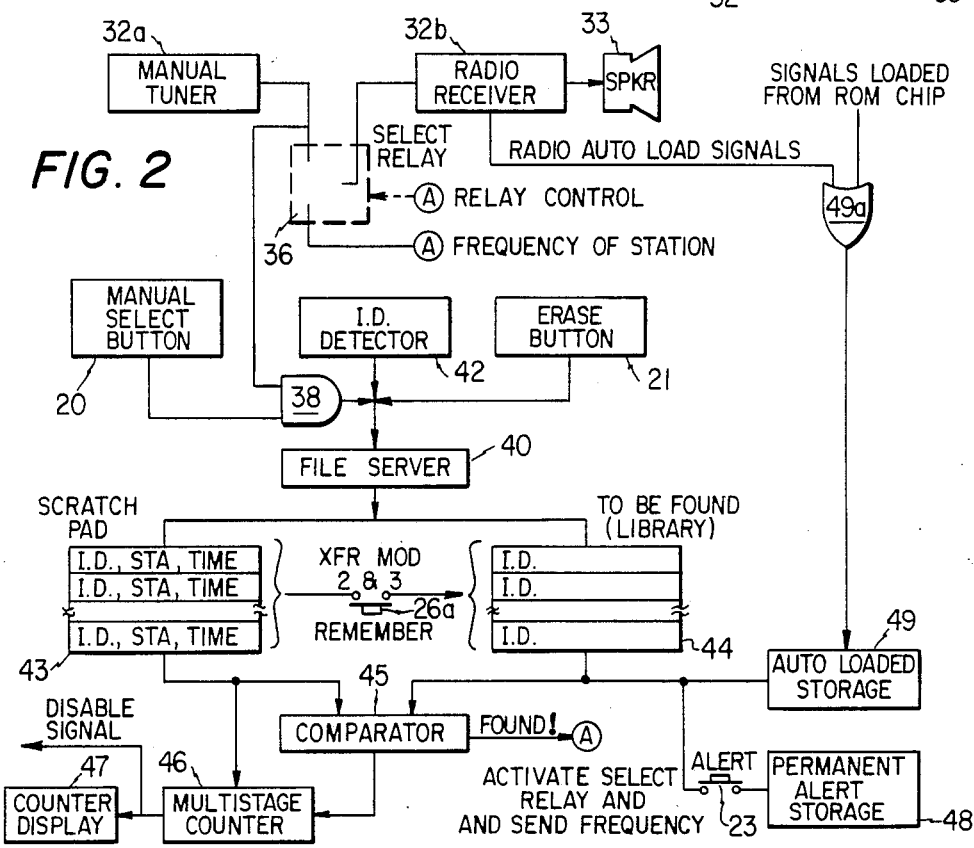
FIG. 2 is an electronic block diagram illustrating the present system in greater detail.

FIG. 2 illustrates in greater detail portions of the system shown in FIG. 1, with like numbers being utilized for like and corresponding parts previously identified. As shown in FIG. 2, a conventional manual tuner 32a is associated with the radio receiver 32b which may comprise any suitable broadcast receiver 32, as previously noted. Tuner 32a and receiver 32b include a digital tuner which may tune receiver 32b to any desired station in response to digital tuning signals. The audible sound from the radio receiver 32b is broadcast over the speaker 33. A select relay is connected between the manual tuner 32a and the radio receiver 32b and is utilized to transmit digital tuning signals to the radio receiver 32b to tune the receiver to a different station in order to broadcast a desired audio segment.

The tuner 32a and receiver 32b are applied to a relay 36 which may be activated by signal A to cause tuning of receiver 32b to a desired station. The output of the manual tuner 32a is applied as an input to an AND gate 38. The output of the "Remember" button 26a is also applied as an input to the AND gate 38. The output of gate 38 is applied to a file server 40, along with an input from an ID detector 42 and the input from the "Erase" button 21. Depression of button 26a causes digital representations of the frequency of the station currently broadcast by receiver 32b to be sent to file server 40. This information is transmitted along with data from ID detector 42. The output of the file server 40 is applied to a scratch pad memory 43 and to a "to be found" library memory 44. The outputs of memories 43 and 44 are applied to a comparator 45. The output of comparator 45 is utilized to activate the select relay 36 and to transmit a digital station frequency via select relay to the radio receiver 32b in order to cause the desired audio segment to be played over the speaker 33. The "Remember" button 26a is diagramatically coupled between memory 43 and memory 44 to control transfer of data from memory 43 to memory 44. Data from the scratch pad memory 43 may be transferred, under the control of the CPU 10 and button 26a shown in FIG. 1, to the "to be found" library memory 44, as will be subsequently described.

The output of comparator 45 is also output to a multi-stage counter 46, the output of which is connected to display 47 and also to provide a disable signal for application to chip socket 16. Counter 46 also receives an input from scratch pad memory 43. Display 47 may then display the number of times a specified audio segment is played by the system. This is useful for monitoring song playing for surveys and the like. In addition, when ROM chip 18 is used, the disable signal may be generated by counter 46 after a song or songs have been played a specified numbers of times, the disable signal then being applied to chip socket 16 to disable further use of ROM chip 18.

A permanent alert storage 48 is connected through alert button 23 to an input of comparator 45. Preselected warning signals are stored in storage 48. When button 23 is depressed, and the comparator 45 detects a matching warning signal in scratch pad memory 43, a found signal is generated to actuate relay 36 to tune receiver 32b to a selected radio station.

Externally loaded Radio Auto Load Signals received from a radio station after depression of button 19 are applied to an input of OR gate 49a. Externally loaded signals received from ROM chip 18 are applied as a second input to gate 49a. When a signal is applied to either input to gate 49a, the audio segment signals are applied through gate 49a for storage in auto loaded storage. These stored externally loaded signals are then applied as an input to comparator 45. Matching of these externally loaded signals with signals in scratch pad memory 43 causes found signals to be generated, and the radio receiver 32b is tuned to the desired station to play the song stored from the external source.

While the gate 38, ID detector 42, file server 40, memories 43 and 44, and comparator 45 and the other circuits are illustrated as discrete circuits in FIG. 2 for clarity of description, it will be understood that most of the functions of these circuits will normally be performed by the CPU 10, as will subsequently be described in greater detail.

Figure 3:
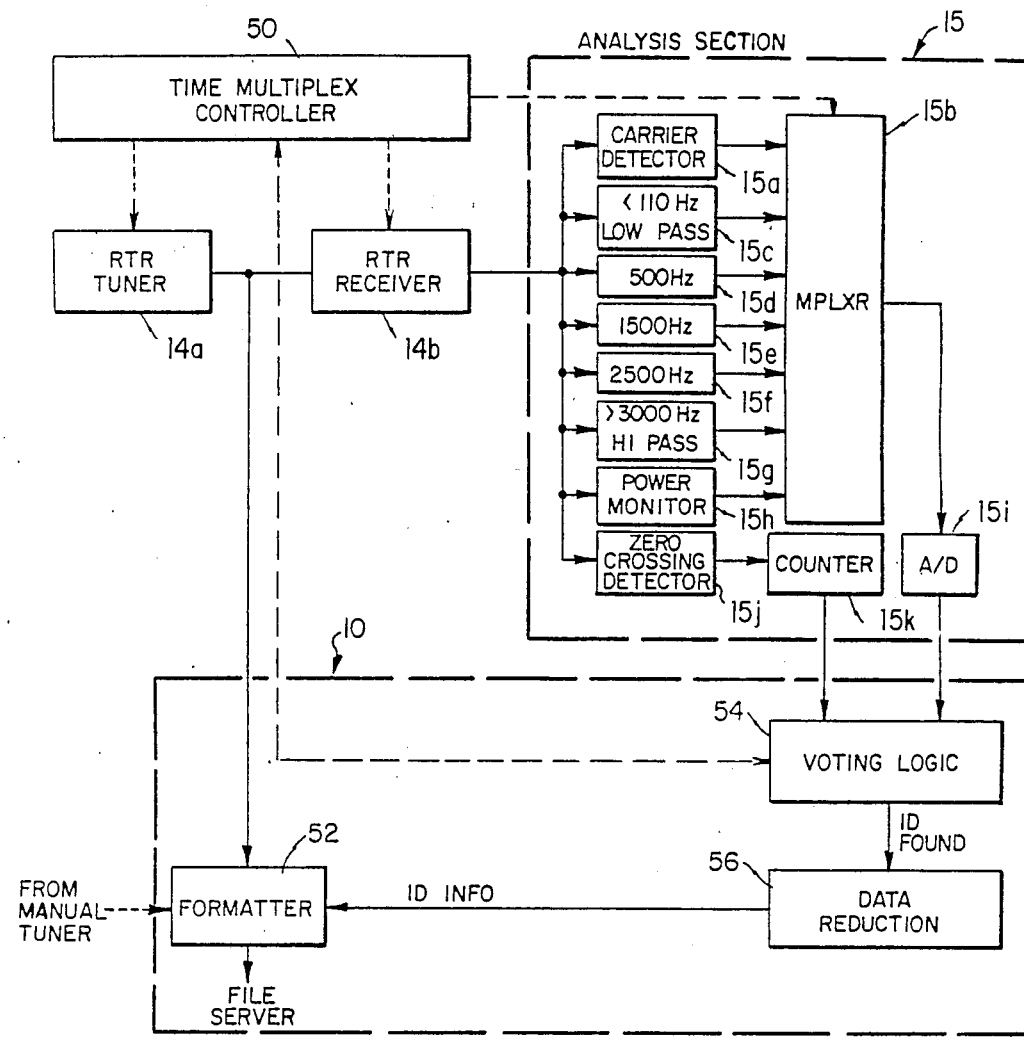
FIG. 3 is a block electronic diagram of the ID detection shown in FIG. 2.

FIG. 3 illustrates in additional detail the ID detector 42 shown in FIG. 2. A time multiplex controller 50 operates to control the RTR tuner/receiver 14 previously described. The output from tuner 14 is applied directly to a formatter 52 which digitizes the signals, along with the output from data reduction 56, and then applies a controlled output to the file server 40, previously noted. The output from the AND gate 38 from the manual tuner is also applied to the formatter 52.

The output from the dedicated RTR receiver 14 is applied to the analysis section 15 previously described. The analysis section 15 operates upon the output of the RTR receiver 14 in order to analyze audio segments for storage of certain ID characteristics or "fingerprints" and also analyzes later audio segments for comparison with a stored ID in order to detect and play a desired audio segment. It will be understood that different audio segments will have different "fingerprints" due to the difference in frequency components, amplitude of the various frequency components and variations in time, in frequency and amplitude. The analysis section includes numerous circuits detecting various aspects of an audio signal. For example, the analysis section 15 includes a carrier detector 15a which detects the presence of a radio carrier signal. The output of the carrier detector is applied to a multiplexer 15b which is controlled by the time multiplexer controller 50. The audio signals from the receiver 14 are also applied to a series of bandpass filters 15c–15g. For example, bandpass filter 15c passes low frenquency signals below 120 Hz. Bandpass filter 15d passes only signals within a small bandpass centered around 500 Hz. filter 15e passes only a narrow bandpass centered around 1500 Hz, while filter 15f passes only a small bandpass filter around 2500 Hz. The high pass filter 15g passes only frequencies above approximately 3000 Hz.

In addition, a power monitor 15h detects the audio signals and generates an output proportional to the power of the detected signal. The outputs from the circuits 15a–15h are applied to the multiplexer 15b which provides a multiplexed signal. This signal is passed through an analog-to-digital converter 15i in order to generate a digital signal for application to the voting logic 54, to be subsequently described.

In addition, the audio signal is applied to a zero crossing detector 15j which generates indications of zero crossings. These zero crossings are counted by a counter 15k and the number of zero crossings are applied to the voting logic 54.

It will be seen that the various parameters detected by the circuits of the analysis section 15 provide valuable input as to whether or not a song is being played, whether voice is occurring or whether silence is occurring on the radio station. These parameters are applied to the voting logic 54 in order to enable detection of the start and ending of songs.

The present system utilizes conventional circuitry for the performance of the various desired functions in the analysis section 15. It will be understood that the present system may be utilized to automatically record desired songs with the use of selective operation of a tape recorder or a recorder. In such case, the radio output would be directed to the recorder rather than to the radio speaker. The term "broadcast" will thus be understood to mean actual broadcast over the radio speaker or broadcast to a tape recorder or other peripheral device attached to the radio. In use with the present invention, for example, a tape recorder might be attached during the day, and when the user returns, his favorite songs have been recorded for his enjoyment. The system utilizes conventional digital formatting and storage techniques long used in numerous digital computer environments.

The outputs of the analysis section 15 are applied to a conventional voting logic circuit 54 which generates an ID "found" signal to energize light 28 only if a predetermined probability of an ID has occurred. Circuit 54 thus eliminates false detection of audio signals caused by static, weak signals and the like. The output of the voting logic 54 is applied to the data reduction circuit 56 wherein the data is compressed and then applied to the formatter 52 application as a digital signal to the file server 40. The functions of formatter 52, voting logic 54 and data reductions 56 will normally be performed by the CPU 10.

Figure 4:
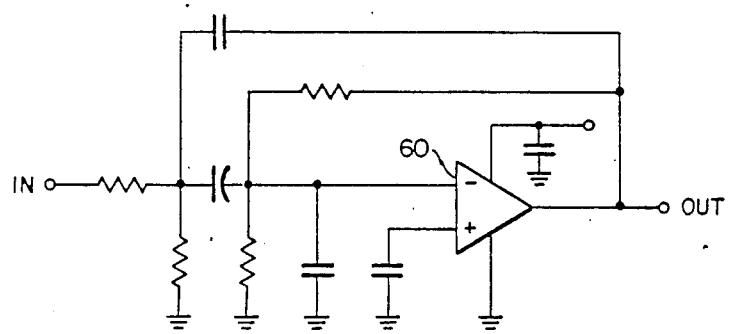
FIG. 4 is an electrical schematic of a portion of the analysis section shown in FIG. 3.

FIG. 4 illustrates a conventional bandpass filter which may be tuned by selection of capacitor and resistance values in order to detect different frequency portions. A plurality of circuits such as shown in FIG. 4 may be connected in parallel and utilized in analysis section 15 to provide the desired frequency analysis. The banpass filter illustrated in FIG. 4 utilizes a differential amplifier 60 which is manufactured and sold by various electronic manufacturers. The bandpass filters thus enable a time varying "fingerprint" or the first few notes of a song to be generated. This fingerprint is stored as an ID which is later used to again recognize the same song.

The present system as specifically illustrated in FIGS. 2 and 3 may be operated in at least three different modes. In Mode 1, the operator is required to quickly push the "Manual Select" button 20 in order to remember an audio segment which is currently being broadcast on a particular station. Thereafter, the system will search for the remembered audio segment on all stations and will automatically play the full song or musical composition which occurs after the remembered audio segment.

In Mode 2, the system continuously remembers for a predetermined period of time the audio being broadcast over a particular station being listened to. If the listener hears a song he wishes to remember, the listener may then push the "Remember" button 26a and the system will transfer data from memory 43 to memory 44 to store the ID for the song which has just been heard. The second mode of operation does not then require the quick action by the listener in depressing the "Manual Select" button 20 for that period. In this mode, if the listener turns to another station, time must lapse for this mode to operate, inasmuch as the system is only temporarily storing the station being listened to.

In Mode 3 of operation, the system is continuously scanning all radio stations being received by the receiver and stores for a limited period of time all ID's from all songs being played on all stations. Therefore, the listener may turn to any station at any time and may hit the "Remember" button 26a without any time lapse and still store a previously played ID.

As previously noted, other techniques for storing "fingerprints" or ID's for songs and the like will be apparent. Broadcast stations will utilize the capabilities provided by the present system to assist in loading various song ID's. The announcer on the broadcast station would indicate that a series of ID loading segments were about to be played. The listener then depresses the button 19 and the announcer would then play a series of short segments of songs or their representations which would be stored in the system as "ID's". It is possible with the use of various tone coding to store various sequences of songs, such as the top ten country and western songs, the top ten rock and roll songs or the top ten contemporary songs. These ID's could be quickly loaded into the present system with a touch of button 19 and thereafter the listener would automatically hear the programmed top ten songs whenever they were played, regardless of which station the songs were played upon. Similarly, externally loaded "ID's" are stored from ROM chip 18 as previously described.

The CPU 10 is normally programmed to play the songs in the order of priority loaded, such that if one "remembered" song was being played, that song would be finished before another "remembered" song was played. This type of prohibition is programmed into the CPU in order to prevent interruption before a desired song is fully played. In case of simultaneous playing of two remembered songs on two different stations, the priority in which the songs were loaded would be utilized to determine which songs would be played.

The operation of the present system will now be described with respect to the previously described Mode 1 with reference to FIGS. 2 and 3. In operation, the button 25 has been depressed such that the RTR functions will be provided by the system. If button 26 is depressed, radio receiver 32b is operating on a selected station and audible signals are being broadcast to the listener via the speaker 33. If the listener hears a song, sportcast, newscast or the like which he desires to be replayed, the listener then depresses within a predetermined period of time the "Manual Select" button 20. This causes the AND gate 38 to pass the station data from the manual tuner 32a to the formatter 52 (FIG. 3) in the ID detector 42.

Simultaneously with the pressing of the "Manual Select" button 20, the RTR tuner 14 is tuned under the control of CPU 10 to the same station being tuned to by the manual tuner 32a. The RTR receiver 14 is then listening to the same station being listened to by the radio receiver 32b. The output of the station is being applied to the analysis section 15. The audio signals from the listened station are then analyzed by the various bandpass filters and the like in the analysis section 15. The outputs from these analysis circuits are applied to the voting logic 54. Assuming that the listener depressed the "Manual Select" button 20 concurrently with the playing of an audio segment, the voting logic 54 indicates an "ID found" which is compressed by the data reduction circuit 56 and applied to the formatter 52. Upon receiving an indication of the station on the manual tuner 32a and upon receiving a compressed ID, the formatter 52 applies a signal to the file server 40 in properly formatted digital configuration. The ID signal is then applied to the "to be found" library memory 44 for storage.

Thereafter, the time multiplexer controller 50 operates the RTR tuner 14 in order to constantly search the audio outputs of the stations within the range of the tuner 14. Multiplexed outputs of the detected stations are then transmitted from the RTR receiver 14 to the analysis section 15. Analysis section 15 applies analyzed signals to the voting logic 54 which determines if similar ID's have been detected, and if so, applies the ID's through the data reduction 56 to the formatter 52. The station frequency is also applied to each determined ID at formatter 52. The various ID's detected as a result of this multiplexing are temporarily stored in the scratch pad memory 43. The ID's stored in the scratch pad memory 43 and the ID's previously stored in the "to be found" library memory 44 are continuously compared by comparator 45. When a match occurs, a "found" signal is generated and the double pole, double throw select relay 36 is thrown.

The digitized station frequency associated with a particular ID is then applied to the tuner 32a such that the radio receiver 32b is tuned to the desired stations. The speaker 33 broadcasts to the listener the desired previously stored audio segment. In this way, the listener can hear his favorite song which he had previously selected when he hit the "Manual Select" button 20. Power level change 15h may determine when the song is complete, and then the tuner 32a retunes receiver 32b to start the prior station. When a selected song is being played by the system, the CPU 10 prevents any additional searching for that song on that station until the song is complete.

In Mode 1 previously described, the listener had to quickly push the "Manual Select" button 20 when he heard the desired audio segment of a song he desired to remember. In Mode 2 of operation, the analysis section 15 is continually analyzing the output of the station being listened to and the voting logic is applying detected ID's from the data reduction circuit 56 to the formatter 52. The file server is then continuously supplying a series of ID's to the scratch pad memory 43. The ID's are temporarily stored in the scratch pad memory 43 and "ripple through" the memory. If the "Remember" button 26a is not depressed during the time the temporarily stored ID's are "rippling through" the scratch pad memory 43, then the temporarily stored ID's are lost. If, however, the "Remember" button 26a is depressed within a predetermined time interval, such as thirty seconds since the occurrence of the ID, then the ID is transferred for permanent storage in the "to be found" library memory 44. The system then continues to operate thereafter in the same way as previously described in order to play the stored desired memory segment whenever the stored ID occurs on any station within range of the broadcast receiver. In this mode, the listener may hit the "Remember" button 26a near the end of a song and still be able to store its ID in the permanent memory 44.

In the above-described Mode 2, only the ID's occurring on the station listened to are temporarily stored in scratch pad memory 43. Therefore, if the listener turns to another station and finds a desired song near its end, he will not be able to store the ID for that song. Mode 3 of operation of the system eliminates this disadvantage. In Mode 3 of operation, the time multiplexer control 50 continuously multiplexes all stations within range of the broadcast receiver by operation of the RTR tuner 14, as in the search mode previously described. In this instance, the multiplexed ID's generated from the voting logic 54 are applied through the data reduction circuit 56 and through the formatter 52 for temporary storage in the scratch pad memory 43. In this mode, ID's from a plurality of stations are continuously "rippling through" the scratch pad memory 43. If the listener then turns to any station and finds a song in progress, he need only hit the "Remember" button 26a and the temporarily stored ID for that particular station which last occurred is transferred to the "to be found" library memory 44 for permanent storage as an ID. Thereafter, whenever any radio station plays a song containing the stored ID, that song will be broadcast over the speaker 33.

In each of the temporarily stored ID's in the scratch paper memory 43, not only the ID, but a digital indication of the station and the time, are stored. This information is utilized by the comparator 45 in order to provide a priority scheme to play only the most highly desired song in case of simultaneous or concurrent playing of songs on different stations. The station ID, previously noted, is utilized by the CPU in order to tune the manual tuner 32a to the desired station on which an ID has just occurred.

Whenever it is desired to erase the stored memories, the "Erase" button 21 is depressed twice and the memory of the "to be found" library memory 44 is erased. Additional operational modes of the system have been previously described in conjunction with loading of "ID's" from external sources such as from radio stations or from ROM chip 18. Further, as noted, depression of "Censor" button 25 during playing of a designated song causes CPU 10 to thereafter disable the future playing of the designated song. Depression of "Censor" button 25 causes a flag to be placed in association with the censored audio segment, the CPU 10 recognizing the flage to prevent subsequent broadcasting of the censored segment.

Figure 5:
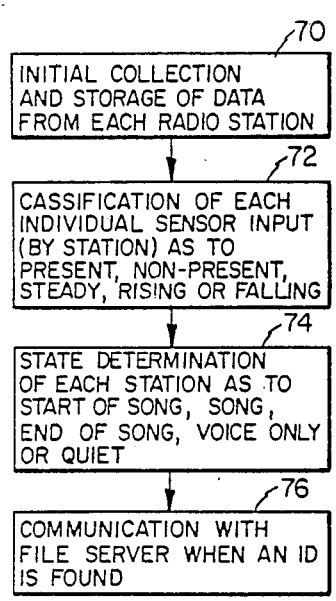
FIGS. 5–9 are flow charts illustrating the operation of the CPU of the present invention.

FIGS. 5-9 are flowcharts which illustrated the operation of the CPU of the present invention. Referring to FIG. 5, the four basic operation routines of the CPU are illustrated. Program routine 70 provides for the initial collection and storage of data from each radio station in response to the continuous multiplexing provided by the time multiplex controller 50. Routine 72 provides classification of each individual sensor unit in the analysis section 15, by station, with regard to whether the particular parameter is present, not present, steady, rising or falling. For example, routine 72 determines whether or not the output of the power monitor 15h is present, not present, steady, rising or falling. Routine 74 determines the state with regard to each station for each multiplexed time segment as to start of song, existence of song, end of song, voice only or quiet. Routine 76 provides communication with the file server 40 when an ID is determined.

Figure 6:
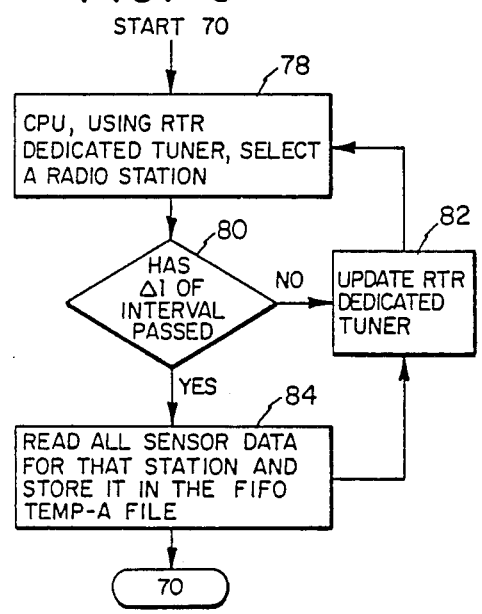

FIG. 6 illustrates routine 70 in more detail. It will be understood that routines 70-76 operate asynchronously. Route 70 is initiated and, at 78 the CPU 10 selects a radio station by utilizing the RTR dedicated tuner 14. At 80, the determination is made as to whether one of the predetermined time intervals of the system has passed. In the preferred embodiment, a time interval of approximately 50 milliseconds will be utilized. If the time interval has not passed, the dedicated tuner 14 is updated at 82 and step 78 is repeated. If the interval has passed, at 84 the sensor data from the analysis section 15 is read for that particular station and is stored in a first in/first out (FIFO) temporary file within the CPU 10.

It will thus be seen that routine 70 causes a plurality of sensor outputs to be stored for each multiplexed station for each of the fifty millisecond time intervals during operation of the system.

Figure 7:
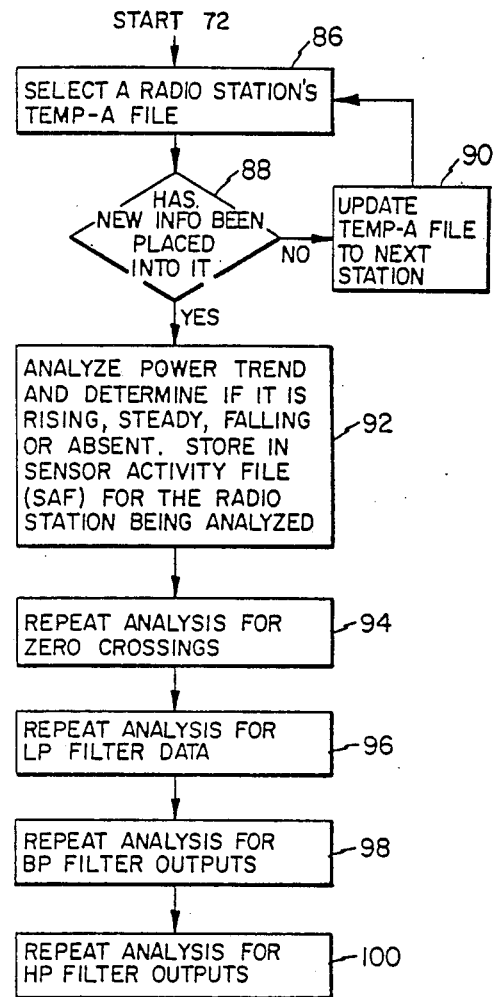

FIG. 7 illustrates additional detail of the operation of the routine 72. At step 86, the stored sensor outputs for a particular time interval for a selected radio station are selected. At step 88, a determination is made as to whether new information has been placed into the particular selected file. If not, the particular file is updated at 90 to go to the parameters stored for the next multiplexed station. If new information has been placed in the particular file being reviewed, the power trend for that particular stored data is analyzed at 92. At 92, the power trend is analyzed and it is determined if the power trend is rising, steady, falling or absent. The results of analyzation are stored in a sensor activity file (SAF) within the CPU 10. The particular analyzed data is stored in a SAF for the particular radio station being analyzed for the particular time interval. At 94, an analysis is made of the stored zero crossings which have been stored for that particular radio station for that particular time interval. The analyzed zero crossing information is stored in the SAF file.

At 96, the low pass filter data from the low pass filter 15c is analyzed to determine if it is rising, steady, falling or absent, and the resulting information is stored in the particular SAF file within the CPU 10. Similarly, at 98 the output from the bandpass filters 15d-15g are analyzed to determine if they are rising, steady, falling or absent and the resultant information is stored in the SAF filter memory. The same analysis is performed on the high pass filter 15f output and the resulting information is stored in the SAF memory. It will be understood that within a particular SAF memory, a large amount of information is stored with respect to each multiplexed time interval for each particular radio station. This information is then utilized by the CPU to determine whether or not the information represents a start of a song, an actual song being played, an end of song, voice only or silence.

Figure 8:
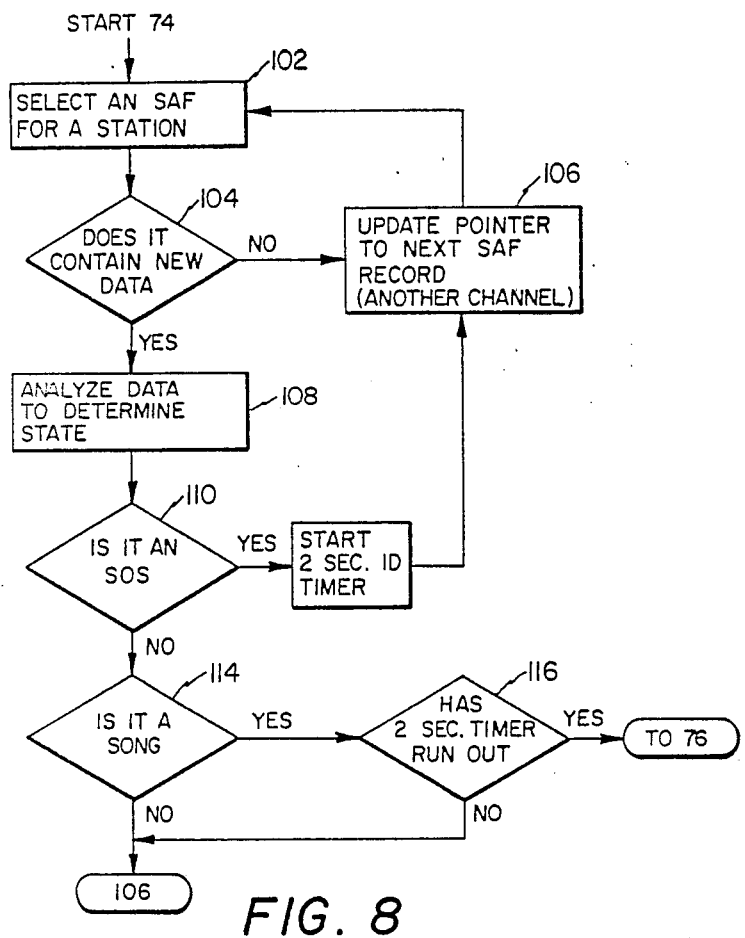

This determination is made by routine 74 which is illustrated in FIG. 8. This routine is begun at 102 wherein an SAF is selected for a particular station. The decision is made at 104 as to whether or not the SAF contains new data not previously considered. If not, the pointer is updated at 106 to the next SAF record for another station and the process is repeated. If the SAF does contain new data, this data is analyzed at 108 to determine its state.

The state of the data is determined by predetermined voting logic stored within the CPU 10. For example, if the power is rising from a previous quiet position, the zero crossing is changing, the low pass filter is changing and the remaining bandpass filters are present, this is an indication of a start of song. Similarly, if the power is steady, the zero crossing indications are steady, the low pass filter output is steady and the remaining bandpass filters are present, this is an indication of the existence of a present song.

If the power is decreasing into a quiet level, the zero crossings are changing, the low pass filter outputs are changing and the remaining bandpass filters are present, this is an indication of end of song. If the power is steady, the zero crossings are steady, the low pass filter outputs are not present, and the remaining bandpass filters are present, this is an indication of voice. If no outputs are detected from the zero crossing, the bandpass filters and the low pass filter, this is an indication of silence and no song or voice being played.

Figure 9:
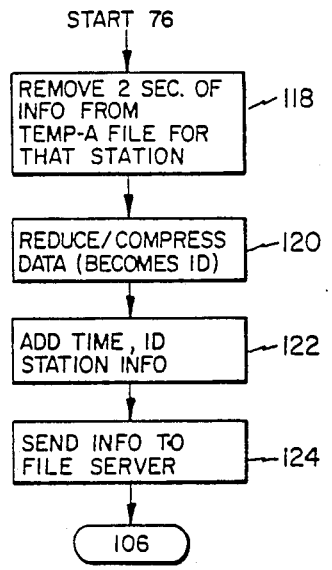

A determination is made at 110 as to whether or not the state is a start of song. If so, a two second identification timer is begun at 112 and step 106 repeated. If not, a determination is made at 114 as to whether or not the state is a song currently being played. If yes, a determination is made at 116 as to whether or not the two second timer has run out. If yes, the system program goes to the start of routine 76 as shown in FIG. 9. If a negative determination is made at step 114 or 116, the routine returns to step 106.

FIG. 9 illustrates in greater detail the routing 76 which provides communications with the file server when an ID is found. The routine is initiated at step 118 wherein two seconds of information are removed from the temporary file within the CPU for the particular station in which a song is playing. At 120, the data is reduced and compressed in order to become an ID representation. At 122, the time, ID, number and station information is added to the compressed data. At 124, the information is transmitted to the file server 40 as previously explained in FIG. 2. The system then returns to step 106 for reiteration.

It will thus be understood that the present system provides a technique for allowing the listener of a broadcast receiver to hear a desired audio segment without continous manual searching of the dial. Whenever a desired audio segment is detected by the system, it is automatically played over the speaker so that the listener can listen to his favorite music, news, sports or other audio information.

Whereas the present invention has been described with respect to specific embodiments thereof, it will be understood that the invention is capable of numerous rearrangements, modifications and substitutions or parts without departing from the spirit of the invention.

What is claimed is:

1. A method of detecting and playing desired audio programs over a broadcast receiver which may be selectively tuned to receive broadcast signals from any one of a plurality of different broadcast stations comprising:

inputting from an external source a plurality of representations each representing a desired audio segment, storing said representations, scanning the audio programs being broadcast over the receiver by a plurality of different broadcast stations, generating in response to said scanning step representations each representing a first portion of at least one of said audio programs, each audio program further comprising a remaining portion, comparing said stored representations with said generated representations, and playing a remaining portion of a desired audio program over the broadcast receiver when said comparing step determines a match between the stored representation of a desired audio segment and a generated representation of said at least one audio program.

2. The method of claim 1 wherein said external source comprises a removable memory device storing a plurality of representations of desired audio segments.

3. The method of claim 2 wherein said audio segments represent a series of musical compositions.

4. The method of claim 2 wherein said removable memory device comprises a semiconductor read only memory.

5. The method of claim 1 wherein said external source comprises radio waves transmitted from a remote broadcast station.

6. The method of claim 1 and further including the steps of selecting an audio segment currently being broadcast on said receiver, and storing a representation of the selected audio segment.

7. The method of claim 1 and further including the steps of selecting an audio segment previously broadcast on a station within a predetermined time interval, and storing a representation of the selected audio segment.

8. The method of claim 1 and further comprising:
tuning the broadcast receiver from a first station to a second station upon the occurrence of said second station playing one of said desired audio segments, and
returning the broadcast receiver to said first station after the desired audio segment has been broadcast over said second station.

9. The method of claim 1 and further comprising:
tuning the broadcast receiver from a first station to a second station upon the occurrence of said second station playing one of said desired audio segments, and
terminating broadcasting over the broadcast receiver after the desired audio segment has been broadcast over said second station.

10. The method of claim 1 and further comprising:
playing said desired audio programs only a predetermined number of times, and
inhibiting further playing of said desired audio programs after said predetermined number of times.

11. The method of claim 1 and further comprising:
counting the number of times each of said desired audio programs are played.

12. The method of claim 1 and further comprising censoring a desired audio program and preventing subsequent playing of said selected audio program.

13. The method of claim 1 and further comprising displaying stations being scanned.

14. A method of detecting and playing desired audio programs over a broadcast receiver receiving broadcast station signals comprising:

inputting from an external source representations each representing a desired audio segment, storing said representations, generating representations each representing a first portion of at least one of said audio program, each audio program further comprising a remaining portion, comparing said stored representations with the generated representations, and playing a remaining portion of a desired audio program over the broadcast receiver when said comparing step determines a match between the stored representation of a desired audio segment and a generated representation of said at least one audio program.

15. The method of claim 14 wherein said external source comprises a removable memory device storing a plurality of desired audio segment representations.

16. The method of claim 15 wherein said desired audio segment representations represent a series of musical compositions.

17. The method of claim 15 wherein said removable memory device comprises a semiconductor read only memory.

18. The method of claim 14 wherein said external source comprises radio waves transmitted from a remote broadcast station.

19. The method of claim 14 and further comprising:
playing only said desired audio program over the broadcast receiver.

20. A system for detecting and playing desired audio programs over a broadcast receiver which may be selectively tuned to receive broadcast signals from any one of a plurality of different broadcast stations comprising:

means for inputting from an external source a plurality of representations each representing a desired audio segment, means for storing said representations, means for scanning the audio programs being broadcast over the receiver by a plurality of different broadcast stations, means for generating representations that each represents a first portion of at least one of said audio programs, each audio program further comprising a remaining portion, means for comparing said stored representations with said generated representations, and means for playing a remaining portion of a desired audio program over the broadcast receiver when the comparing means determines a match between the stored representation of a desired audio segment and a generated representation of said at least one audio program.

21. The apparatus of claim 20 wherein said external source comprises a removable memory device storing a plurality of desired audio segment representations.

22. The apparatus of claim 21 wherein said desired audio segment representations represent a series of musical compositions.

23. The apparatus of claim 21 wherein said removable memory device comprises a semiconductor read only memory.

24. The apparatus of claim 20 wherein said external source comprises radio waves transmitted from a remote broadcast station.

25. The apparatus of claim 20 and including means for enabling the listener to select and store a representation of an audio program currently being broadcast on said receiver.

26. The apparatus of claim 20 and including means for enabling the listener to select and store a representation of an audio program previously broadcast on a station within a predetermined time interval.

27. The apparatus of claim 20 and further comprising:
means for tuning the broadcast receiver from a first station to a second station upon the occurrence of said second station playing one of said desired audio programs, and
means for returning the broadcast receiver to said first station after the desired audio program has been broadcast over said second station.

28. The apparatus of claim 20 and further comprising:
means for tuning the broadcast receiver from a first station to a second station upon the occurrence of said second station playing one of said desired audio programs, and
means for terminating broadcasting over the broadcast receiver after the desired audio program has been broadcast over said second station.

29. The apparatus of claim 20 and further comprising:
means for playing said desired audio programs only a predetermined number of times, and
means for inhibiting further playing of said desired audio programs after said predetermined number of times.

30. The apparatus of claim 20 and further comprising:
means for counting the number of times each of said desired audio programs are played.

31. The apparatus of claim 20 wherein said means for storing includes a first memory, and further comprising:
a second memory for storing representations of audio segments selected from broadcasts over the broadcast receiver by the listener, and
a third memory for temporarily storing audio from the broadcast receiver,
the data stored in said first and second memories being compared by said means for comparing with the data in said third memory.

* * * * *